US012763131B2

(12) United States Patent
Sinangil

(10) Patent No.: US 12,763,131 B2
(45) **Date of Patent: *Oct. 13, 2026**

(54) COMPUTE IN MEMORY SYSTEM

(71) Applicant: Taiwan Semiconductor Manufacturing Company, Ltd., Hsinchu (TW)

(72) Inventor: Mahmut Sinangil, Campbell, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 131 days.

This patent is subject to a terminal disclaimer.

(21) Appl. No.: 18/781,286

(22) Filed: Jul. 23, 2024

(65) Prior Publication Data

US 2024/0379149 A1 Nov. 14, 2024

Related U.S. Application Data

(63) Continuation of application No. 17/734,701, filed on May 2, 2022, now Pat. No. 12,073,869, which is a (Continued)

(51) Int. Cl.
*G11C 11/4093* (2006.01)
*G11C 11/408* (2006.01)
(Continued)

(52) U.S. Cl.
CPC ...... *G11C 11/4085* (2013.01); *G11C 11/4093* (2013.01); *G11C 11/4094* (2013.01); *H03M 1/802* (2013.01)

(58) Field of Classification Search
CPC ............ G11C 11/4085; G11C 11/4093; G11C 11/4094; H03M 1/802
See application file for complete search history.

(56) References Cited

U.S. PATENT DOCUMENTS

| | | | | |
|---|---|---|---|---|
| 5,398,209 A | | 3/1995 | Iwakiri et al. | |
| 8,482,950 B2 | * | 7/2013 | Kitagawa ........... | G11C 13/0064 365/207 |

(Continued)

FOREIGN PATENT DOCUMENTS

| | | | |
|---|---|---|---|
| CN | 110364203 | A | 10/2019 |
| KR | 20080061407 | A | 7/2008 |

(Continued)

OTHER PUBLICATIONS

Jaiswal et al. "BT SRAM Cell as a Multi-bit Dot Product Engine for Beyond von-Neumann Computing", arXiv:1802.08601v2 [cs. ET];10 pages; dated Oct. 16, 2018.

*Primary Examiner* — Min Huang
(74) *Attorney, Agent, or Firm* — Merchant & Gould P.C.

(57) ABSTRACT

An example computing device includes an array of memory cells, such as 8-transistor SRAM cells, where the read bit-lines are isolated from the nodes storing the memory states such that simultaneous read activation of memory cells sharing a respective read bit-line would not upset the memory state of any of the memory cells. The computing device also includes an output interface having capacitors connected to respective read bit-lines and have capacitance that differ, such as by factors of powers of 2, from each other. The output interface is configured to charge or discharge the capacitors from the respective read bit-lines and to permit the capacitors to share charge with each other to generate an analog output signal, where the signal from each read bit-line is weighted by the capacitance of the capacitor connected to the read bit-line. A method of making a computing device as described is also disclosed.

20 Claims, 8 Drawing Sheets

Related U.S. Application Data continuation of application No. 17/034,701, filed on Sep. 28, 2020, now Pat. No. 11,322,195.

(60) Provisional application No. 62/941,330, filed on Nov. 27, 2019.

(51) Int. Cl.
*G11C 11/4094* (2006.01)
*H03M 1/80* (2006.01)

(56) References Cited

U.S. PATENT DOCUMENTS

| | | | | |
|---|---|---|---|---|
| 11,322,195 | B2 * | 5/2022 | Sinangil | H03M 1/802 |
| 12,073,869 | B2 * | 8/2024 | Sinangil | G11C 11/419 |
| 2008/0232184 | A1 | 9/2008 | Ohsawa | |
| 2011/0116296 | A1 | 5/2011 | Kitagawa et al. | |
| 2014/0198560 | A1 | 7/2014 | Lee et al. | |
| 2016/0232951 | A1 | 8/2016 | Shanbhag et al. | |
| 2018/0158517 | A1 | 6/2018 | Shu et al. | |
| 2019/0043560 | A1 | 2/2019 | Sumbul et al. | |
| 2019/0228825 | A1 * | 7/2019 | Hecht | G11C 11/419 |
| 2020/0410334 | A1 | 12/2020 | Choi et al. | |

FOREIGN PATENT DOCUMENTS

| | | | |
|---|---|---|---|
| KR | 20110090980 | A | 8/2011 |
| KR | 20140139539 | A | 12/2014 |
| KR | 20190053854 | A | 5/2019 |

* cited by examiner

COMPUTE IN MEMORY SYSTEM

CROSS-REFERENCE TO RELATED APPLICATIONS

This application is a continuation of U.S. application Ser. No. 17/734,701, filed May 2, 2022, now U.S. Pat. No. 12,073,869, which is a continuation of U.S. application Ser. No. 17/034,701, filed Sep. 28, 2020, now U.S. Pat. No. 11,322,195, which application claims the benefit of U.S. Provisional Application No. 62/941,330 titled "COMPUTER IN MEMORY SYSTEM" and filed Nov. 27, 2019, the disclosure of which are hereby incorporated by reference in their entirety.

BACKGROUND

This disclosure relates generally to memory arrays used in data processing, such as multiply-accumulate operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Effort are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
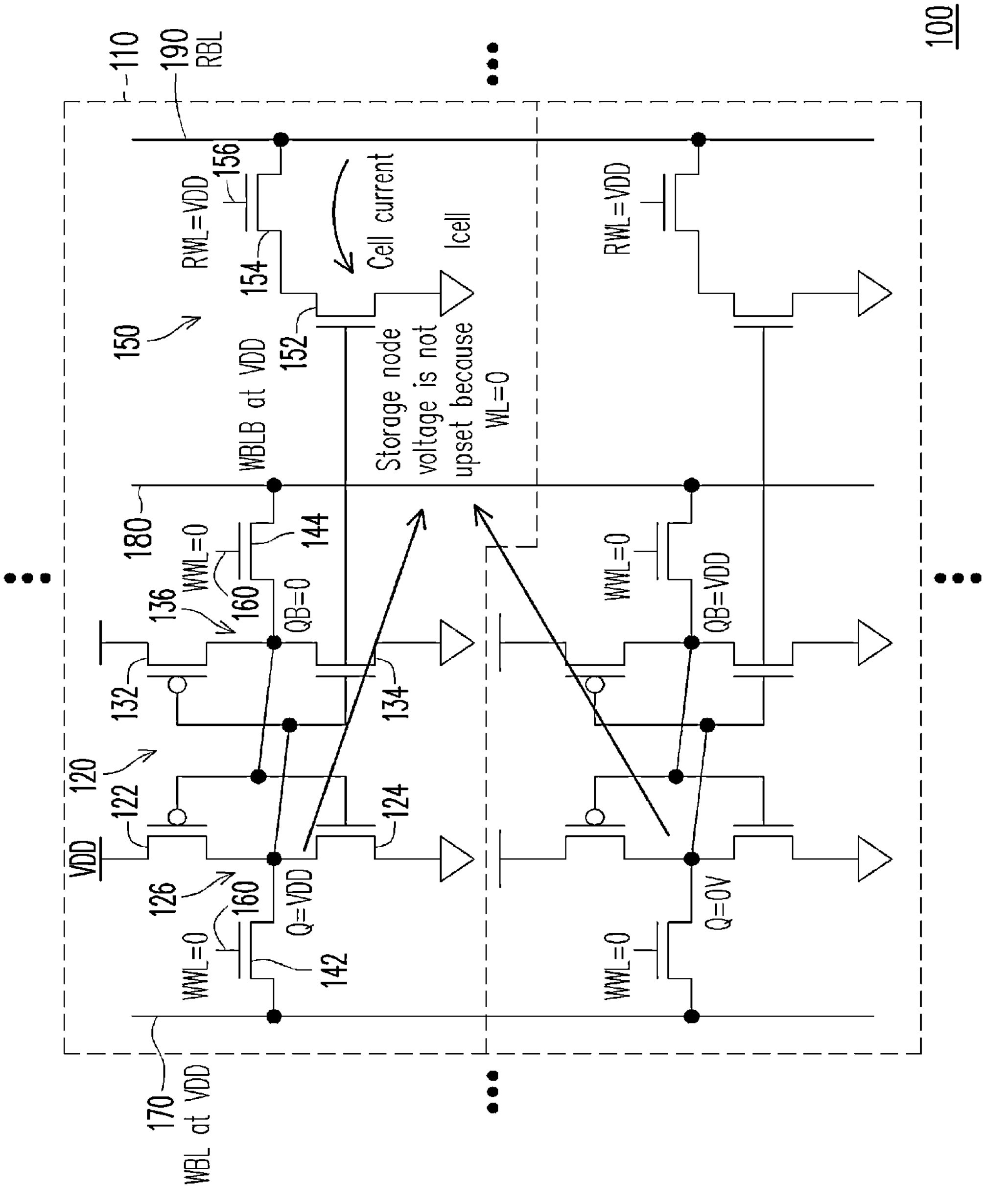
FIG. 1 is a schematic diagram illustrating an example of memory cells with read bit-lines (RBLs) isolated from write bit-lines (WBLs) in a portion of a compute-in-memory system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Specific examples shown in this disclosure relate to computing-in-memory. An example of applications of computing-in-memory is multiply-accumulate operations, in which an input array of numbers are multiplied (weighted) by the respective elements in another array (e.g., column) of numbers (weights), and the products are added together (accumulated) to produce an output sum. This is mathematically similar to a dot product (or scalar product) of two vectors, in which procedure the components of two vectors are pair-wise multiplied with each other, and the products of the component pairs are summed. In certain artificial intelligence (AI) systems, such as artificial neural networks, an array of numbers can be weighted by multiple columns of weights. The weighting by each column produces a respective output sum. An output array of sums thus is produced from an input array of numbers by the weights in a matrix of multiple columns.

A common type of integrated circuit memory is a static random-access memory (SRAM) device. A typical SRAM memory device has an array of memory cells. In some examples, each memory cell uses six transistors (6T) connected between an upper reference potential and a lower reference potential (e.g., ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line (WL) to control access to the memory cell during read and write operations by selectively connecting the cell to its bit lines (BLs). When the word line is enabled, a sense amplifier connected to the bit lines senses and outputs stored information. Input/output (I/O) circuitry connected to the bit lines are often used when processing memory cell data. Both bit lines can be low/high when multiple WLs are activated and bit-cells are storing opposite values initially.

In multi-bit applications, such as compute-in-memory, the stability of a 6T bit-cell can be degraded when multiple word lines are activated at the same time. When multiple word lines are activated at the same time, both bit line voltages will be pulled low. This can cause an upset for the stability of the bit cell and cause its state to be flipped. Additionally, using logic-rule based SRAM bit-cells has significant area overhead, due to, among other things, storage needed for intermediate calculations. Still further, binary input/weight/output using known memory arrangements can be too simplistic for general usage of compute-in-memory, as many problems to be solved by algorithms used in computer-in-memory require multi-bit computation steps. Certain embodiments disclosed in this disclosure provide multi-bit compute-in-memory, with direct results without requiring intermediate storage space, and without upsetting the stability of each cell.

In accordance with some aspects of the present disclosure, a compute-in-memory (CIM) system includes a memory array memory array in which each memory cell has mutually isolated read bit-line (RBL), through which the store information can be read, and write bit-line (WBL), through which information can be written to the cell. For example, an 8T SRAM cells, which adds to a 6T SRAM a 2T read port connected to a read word line (RWL) and a RBL. Because the RBL of the 8T bit cell has is decoupled from the 6T memory cell, multiple RWLs turning on simultaneously does not upset the storage node voltage. Some disclosed embodiments provide a CIM system that has an array of 8T SRAM cells including a plurality of RWLs and RBLs.

In according to certain aspects of the present disclosure, a CIM system having a multi-bit input can be realized with multiple RWL pulses. For example, in some embodiments, an input signal in multiply-accumulate operations can be realized by a number of RWL pulses, the number being proportional to the input. In some examples, a 4-bit input can be used, but other bit widths are within the scope of the disclosure. For example, an input of 0 is represented by 0 ($0000_2$) RWL pulses, an input of $3_{10}$ ($0011_2$) is represented by 3 RWL pulses, an input of $15_{10}$ ($1111_2$) is represented by 15 RWL pulses, and so on.

In some embodiments, the input signals can be multiplied by multi-bit (e.g., four-bit) weights (i.e., weight values) arranged in a column. Accumulation of multi-bit-weighted inputs can be realized by charging a common RBL from all cells in a column corresponding to each bit of the multi-bit weight; the voltage on each RBL thus is indicative of the sum of the currents from each cell connected to the RBL and is thus indicative of the sum of the inputs, each weighted by the binary weight associated with the column. A multiply-accumulate function is thus performed on the RBLs, and the RBL voltage is proportional to a bit-wise multiplication of weight bit with multi-bit inputs. Charge sharing among RBLs is then performed for each column of multi-bit weights, with binary-weighted capacitors, i.e., capacitors sized according to the respective positions of significance in the multi-bit weights. Accordingly, the most significant bits (MSB) of weight contribute more to the final output than the least significant bits (LSB) of the weight. The charge sharing therefore produces an analog voltage that reflects the correct significance of each RBL. For example, with a column of four-bit weights, the contribution to the final voltage from most MSB would be eight ($2^3$) times the contribution from the LSB; the contribution from the second MSB would be four ($2^2$) times the contribution from the LSB; and the contribution from the third MSB (or second LSB) would be two ($2^1$) times the contribution from the LSB.

In certain further embodiments, an analog-to-digital converter (ADC), such as a Flash ADC, is used in some examples to convert a voltage on the RBLs (after binary-weighted charge sharing such as noted above) to a multi-bit digital output. In some embodiments, for an n-bit output, $2^n-1$ comparators are used for ADC implementation. For example, for a 4-bit output example, 15 comparators are used for the flash ADC implementation. Each comparator in some embodiments has its own input capacitor. These input capacitors may be used as the above-mentioned binary-weighted capacitors for charge sharing. The number of input capacitors each RBL is connected to is related to (e.g., proportional to) the place value of the output bit associated with the RBL in certain embodiments. For example, for a 4-bit output, the RBL for the MSB is connected to 8 ($2^3$) input capacitors; the RBL for the LSB is connected to 1 ($2^0$) input capacitor. The total capacitance connected to each RBL is thus in proportion to the place value corresponding to the RBL. Other bit-width outputs are within the scope of the disclosure.

Referring to FIGS. 1-4, an overview of some example embodiments is provided before the detailed aspects of these embodiments are further explained below. In certain applications, such as artificial intelligence, a model system is proposed. A set of inputs (e.g., numbers) are supplied to the model system, which processes the inputs and generate outputs. The outputs are compared to the desired outputs, and if the outputs are not close enough to the desired outputs, the model system is adjusted and the process is repeated until the output of the model system is sufficiently close to the desired outputs. For example, to have a machine that can read, a model system may be provided with a set of fragments of a letter. The system takes the fragments (inputs) and processes the fragments according an algorithm, and outputs a letter the system determines it received. If the output letter is different from the input letter, the system may be adjusted and be tested again until the output matches the input in a high enough percentage of times.

For some applications, a model system can be a multiply-accumulate system, which processes a set of inputs by multiplying each input with a value, sometimes called a "weight," and sum (accumulate) the products together. The system can include a two-dimensional array of elements arranged in rows and columns, each of the elements storing a weight, and capable of receiving an input and generating an output that is the arithmetic product of the input and the stored weight. The model system can have each input supplied to an entire row of elements and the outputs of each column of the elements added together.

For example, the system (100) shown in FIG. 1 has a column of multiple 8-transistor (8T) static random-access memory (SRAM) cells (110) (only two cells are illustrated in FIG. 1). Each cell (110) is connected to an input line RWL (156) and both cells are connected to the same output line RBL (190). Each cell also has a node Q, which is maintained by the SRAM cell at a voltage indicative of the value (weight) stored in the cell. As can be readily understood from the diagram in FIG. 1, for each cell, for a binary "1" at the input RWL, the cell (110) will draw a current from RBL if Q is "1" and no current if Q is "0;" for a binary "0" at RWL, the cell (110) draws no current regardless of the value at Q. If an amount of current drawn over a given period of time (i.e., a certain amount of charge drawn) above a threshold is considered an output of "1," the output for a single cell (110) is thus given by the following table:

| Input (RWL) | Weight Q | Output (RBL) |
|---|---|---|
| 0 | 0 | 0 |
| 0 | 1 | 0 |

-continued

| Input (RWL) | Weight Q | Output (RBL) |
|---|---|---|
| 1 | 0 | 0 |
| 1 | 1 | 1 |

It is evident from this table that the output is the product of the input and weight.

Furthermore, because the cells (110) in the same column share the same RBL, the current on the RBL is the sum of the current to the cells (110) connected to it. Therefore, the signal on each RBL represents the sum of binary products of the inputs (RWLs) and the respective stored weights.

Figure 2A:
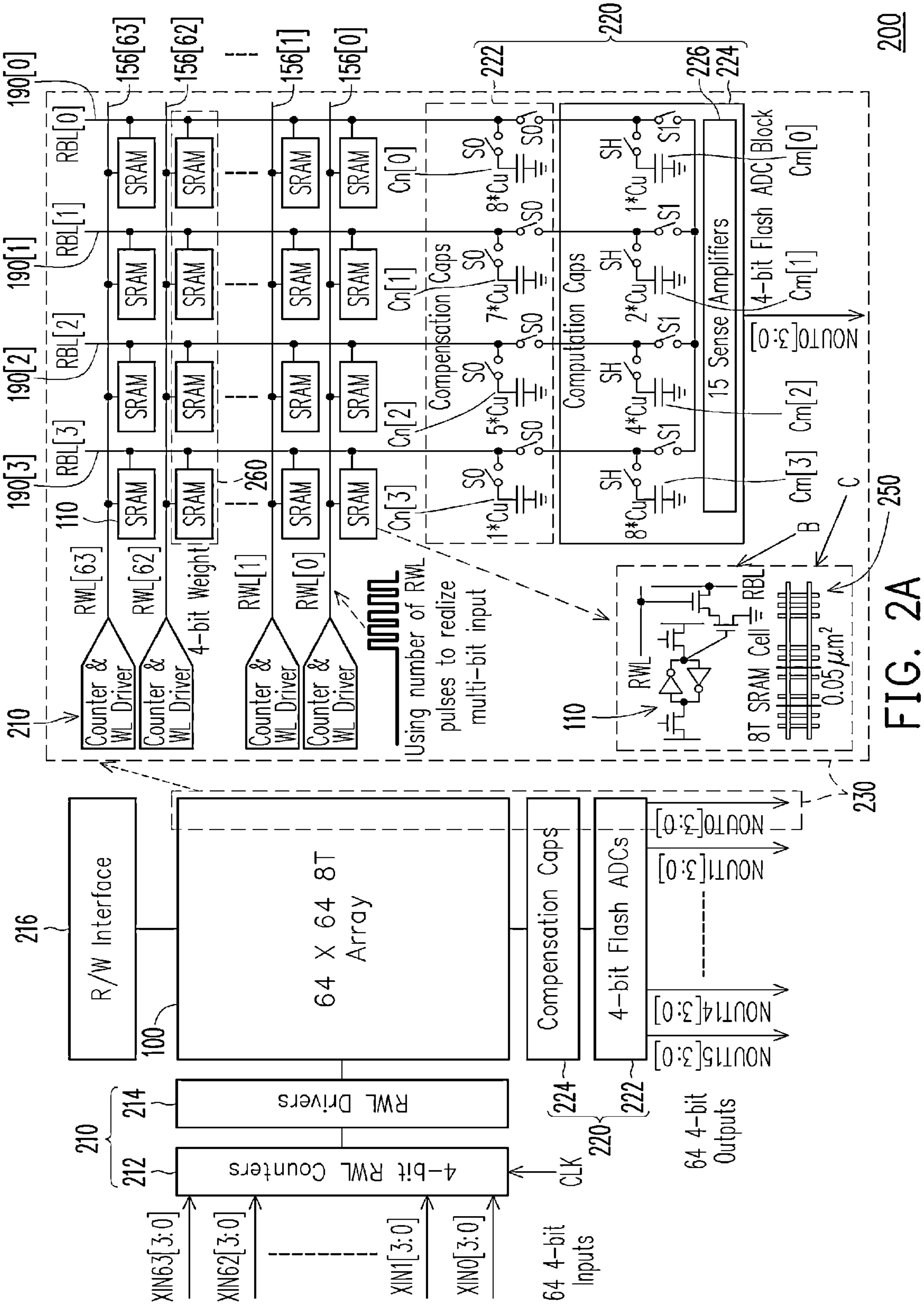
FIG. 2A is a block diagram of a compute-in-memory system and a more detailed block diagram for a portion of the compute-in-memory system, showing a four-bit-precision weight computation sub-system, in accordance with some embodiments.
Figure 2B:
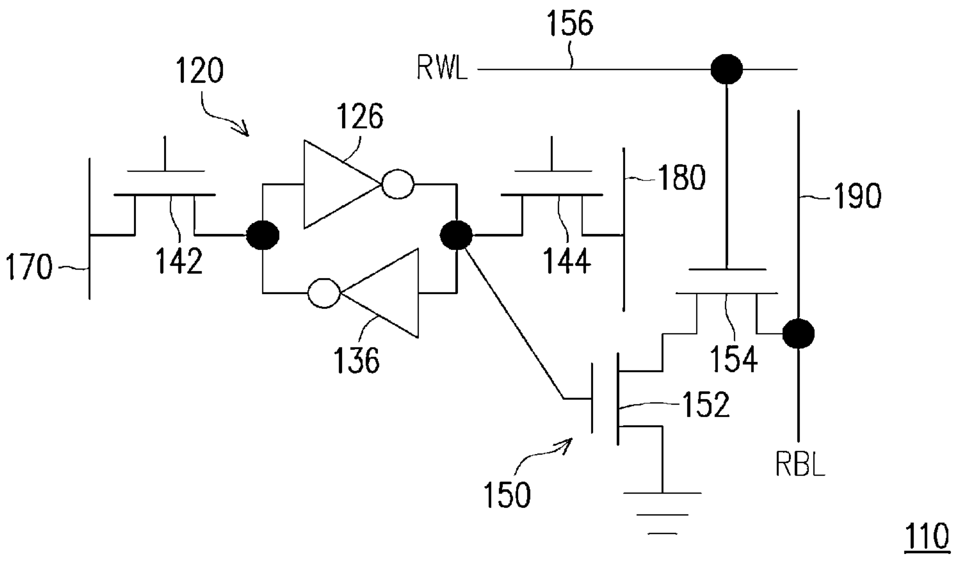
FIG. 2B is a schematic diagram of an eight-transistor (8T) RAM cell, labelled "B," in the system shown in FIG. 2A, in accordance with some embodiments.
Figure 3A:
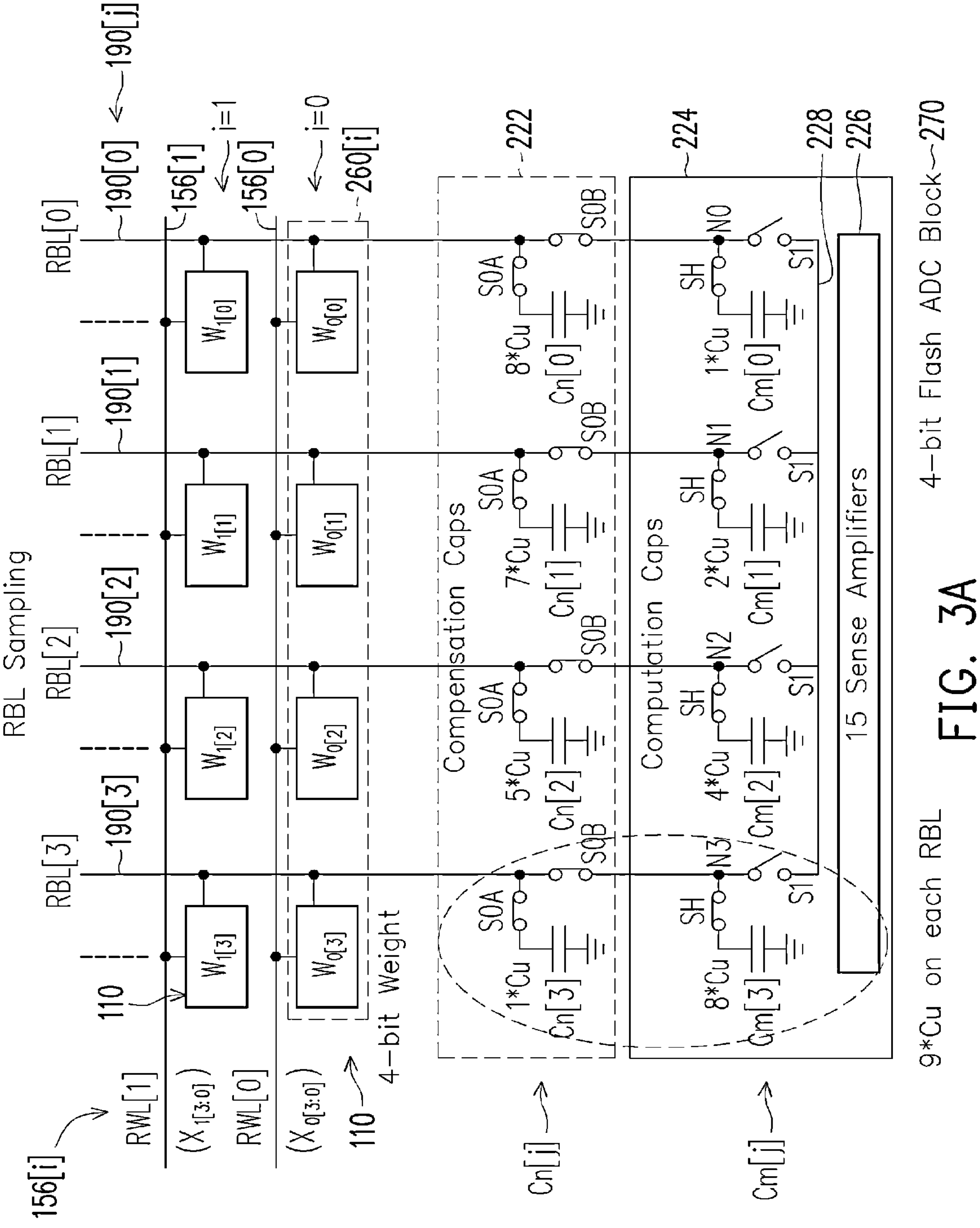
FIG. 3A shows a portion of a compute-in-memory system in a RBL sampling state in accordance with some embodiments.

Referring to FIG. 2A, in a system using multi-bit (in this example four-bit) weights for multiply-accumulation operations, each input (RWL) is provided to multiple (e.g., four) cells (110), each storing one bit of the multi-bit weight. Each RBL is connected to a column of the cells (110) having the same place value (i.e., $2^0$, $2^1$, $2^2$, $2^3$, etc.). With further reference to FIG. 3A, each RBL is connected to a combination of a pair of capacitors—a computation capacitor $C_m$[j] and a compensation capacitor $C_n$[i] for RBL[j], each pair being connected to each other in parallel and connected to the respective RBL when the signal on each RBL is being acquired. The total capacitance of the parallel combination is the same for all RBL's, 9*$C_u$ in this example, where $C_u$ is a unit capacitance. The computation capacitors have capacitances 1, 2, 4 and 8 times $C_u$ for RBL[0], RBL[1], RBL[2], and RBL[3], respectively, for reasons explained below, and the compensation capacitors have capacitances 8, 7, 5 and 1 times $C_u$ for RBL[0], RBL[1], RBL[2], and RBL[3], respectively, such that the total capacitance of the parallel combination is 9*$C_u$.

Given the capacitance on each RBL (9*$C_u$ in this example), the voltage drop (assuming the capacitors are precharged) at each node N0, N1, N2 or N3 (FIG. 3A) due to the current to the cells (110) in the corresponding column is proportional of the sum of binary products of the inputs (RWLs) and the respective stored binary weights for the column. And the proportionality constant for each RBL is the same because the total capacitance for each RBL is the same. At the same time, because of the capacitance of each of the computation capacitors $C_m$ is proportional the place value for the respective RBL, the charge loss from each computation capacitor $C_m$ is also proportional to the place value for the RBL Next, referring further to FIG. 3B, the computation capacitors $C_m$ are disconnected from the compensation capacitors $C_n$ and connected to each other in parallel, i.e., the node N0, N1, N2 and N3 are connected together. The charges stored on the computation capacitors are thus shared, and the voltage at N0, N1, N2 and N3 settles to a level $V=Q_{total}/C_{total}$, where $Q_{total}$ is the sum of the charges on all computation capacitors, and $C_{total}$ is the total capacitance of the parallel combination, i.e., 15*$C_u$ in this example. Because the computation capacitors have capacitance proportional to the place values for the respective RBLs, $Q_{total}$, and thus V, as well and drop in voltage, ΔV, due to discharge, has contributions from each RBL in proportion to the place value for the RBL. That is $$\Delta V=\Sigma_j 2^j I_j,$$

where $I_j$ is the current for the jth RBL and is proportional to the sum of binary products of the inputs (RWLs) and the respective stored weights for the jth RBL. ΔV, therefore is proportional to the sum of products between the inputs and the respective multi-bit weights store in the cells [110].

Figure 4:
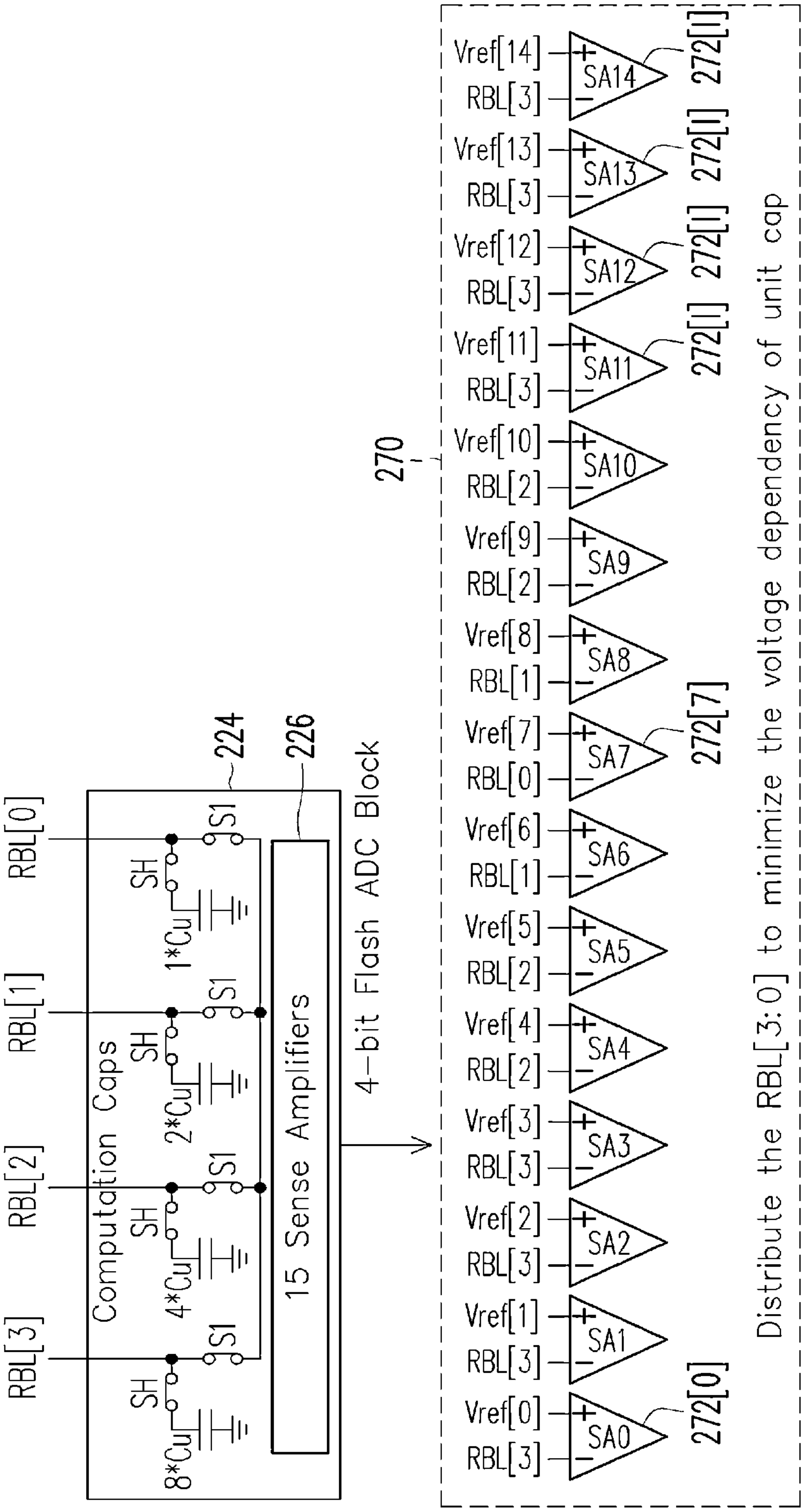
FIG. 4 shows analog-to-digital conversion scheme for processing the voltage on the RBL lines in accordance with some embodiments.

Finally, with additional reference to FIG. 4, the voltage at the nodes N0, N1, N2 and N3 is converted to a digital output by an analog-to-digital converter (ADC) to obtain a digital output corresponding to the sum of products between the inputs and the respective multi-bit weights store in the cells [110].

To explain the above-outlined system and its operation in more detail, a compute-in-memory system in some embodiments includes a memory array (100), which includes rows and columns (which can be either physical or logical rows and columns) of memory cells (110), as well as other components, such as a digital input interface (not shown in FIG. 1) for converting digital inputs to counter pulse trains (e.g., using a binary counter) and output interface (not shown in FIG. 1) for accumulating weighted inputs and outputting digital representations of the accumulated weighted inputs, as explained below.

Each memory cell (110) in this example includes a 6T memory cell (120) and a read port (150). The 6T memory cell (120) includes a first inverter (126), made of a p-type metal-oxide-semiconductor (MOS) field-effect transistor (PMOS) (122) and an n-type MOS field-effect transistor (NMOS) connected in series (i.e., with the source-drain current paths in series) between a high reference voltage (such as $V_{DD}$) and low reference voltage (such as ground); a second inverter (136), made of a PMOS (132) and an NMOS (134) connected in series between the high reference voltage (such as $V_{DD}$) and low reference voltage (such as ground); and two write access transistors (142, 144), which in this example are NMOS's. The inverters (126, 136) are reverse-coupled, i.e., with the output (Q, QB)) (i.e., the junction between source/drain current paths) of one coupled to the input (i.e., the gates) (QB, Q) of the other; the write access transistors (142, 144) each have its source/drain current path connected between a respective junction of the reversed coupled inverters (126, 136) and respective write bit-line (WBL (170), WBLB (180)), and its gate connected to a write word-line (WWL) (160).

Each read port (150) in this example includes a read transistor (152) and a read access transistor (154) in serial connection with each other and connected between the low reference voltage and a data output line, sometimes referred to as a read bit-line (RBL). The read transistor (152) in this example is an NMOS, and its gate is connected to inverted output (QB) of the 6T memory cell (120); the read access transistor (154) in this example is an NMOS, and its gate is connected to a read word-line (RWL). Other types of transistors and connections can be used. For example, PMOS's can be used for both or either of the read transistor (152) and read access transistor (154); the gate of the read transistor (152) can be connected to the non-inverted output (Q) of the 6T memory cell (120).

In operation, to write a bit a memory cell (110), a data bit (1 or 0) (e.g., a voltage corresponding to 1 or 0) is applied to the WBL and its inverse to WBLB. A write signal (e.g., 1) is applied to the write access transistors (142, 144) to make the transistors conducting, thereby storing the data bit at output (Q) of the 6T memory cell (120) and the inverse of the data bit at (QB). The write access transistors (142, 144) can be turned off thereafter, and the value at Q, and the inverse at QB, are maintained. To read the stored data bit, the write access transistors (142, 144) are turned off (WL=0), and the read access transistor (154) is turned on (conducting) by a read signal applied to the RWL. A cell current, $I_{cell}$, corresponding to the voltage at QB (or Q), which in turn signifies the stored value (1 or 0) in the 6T memory cell (120), is thus generated in the RBL and sensed by the circuitry in the output interface (not shown in FIG. 1).

Because the RBL is isolated from output Q or QB of the inverters (126, 136) (i.e., the voltage and current on or in the RBL has substantially no effect at Q or QB) by the read transistor (152) in each read port (150), and/or because the write access transistors (142, 144) are turned off (WL=0), multiple RWL's can be activated (i.e., multiple read access transistors (154) made turned on) simultaneously without upsetting the voltage at Q or QB.

Figure 2C:
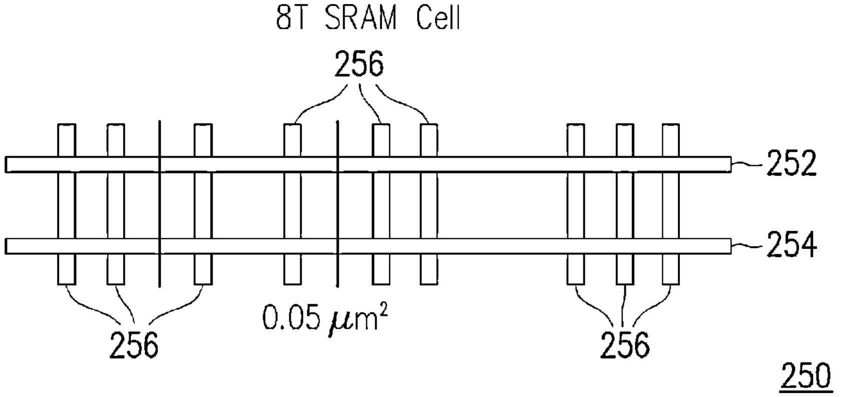
FIG. 2C is a schematic layout of the eight-transistor (8T) RAM cell of FIG. 2B and labelled "C" in the system shown in FIG. 2A, in accordance with some embodiments.

According to some embodiments, as shown in FIG. 2A, a CIM system (200) includes a memory array, such as the one (100) described above, including 8T memory cells (110). In this example, the memory array (100) is an array of 64×64 8T memory cells (110), i.e., memory cells (110) arranged in 64 rows (row i, i=0 through 63) by 64 columns (row j, j=0 through 63), but any other array, including two- and three-dimensional arrays of various sizes, can be used. Each 8T memory cell (110) can be of a structure described above with reference to FIG. 1 and further illustrated in FIG. 2B. Each 8T memory cell (110) can be of any suitable physical structure. For example, the transistors of each 8T memory cell (110) can be field-effect transistors (FET's). In one example, as illustrated in FIG. 2C, the FET's can be formed in the so-called FinFET structure, in which doped semiconductor form ridges, or "fins," that serve as the active regions of the FET's, and that along which source and drain regions can be formed. A conductive material, such as doped polysilicon ("poly"), surround top portions of the fins and serve as gates. For example, as shown in FIG. 2C, transistors of the memory cells (110) can be formed in a FinFET structure (250) along a p-doped fin (252) (for PMOS) and n-doped fin (254) (for NMOS), with poly gates (256) formed across the fins (253, 256).

The memory cells (110) in the array (100) in some embodiments are of identical construction. In other embodiments, the memory cells (110) in the array (100) can be different from each other. For example, the size ratios between the transistors (152, 154) in the respective read ports (150) can be different from memory cell to memory cell, such that the currents generated by the same RWL signal are different.

The CIM system (200) in this example further includes an input interface (210), which in this example includes an array of digital counters (212) and a corresponding array of drivers (214). In this example, there are 64 4-bit counters (212), one for each row of the 64×64 memory cell array (100); each counter (212) outputs a number of pulses per counting cycle corresponding to the number (in this case a 4-bit binary number) at the counter input. For example, an input of 0 ($0000_2$) generates 0 pulses, an input of $3_{10}$ ($0011_2$) generates 3 RWL pulses, an input of $15_{10}$ ($1111_2$) generates 15 RWL pulses, and so on. A driver (214) corresponding to each counter (212) drives the corresponding RWL (190[j] (j=0 through 63)) according to the output pulses from the counter. Thus a train of RWL pules, the number of which per counting cycle is indicative of the digital number at the input of the respective counter (212) is applied to the corresponding RWL (156[i] (i=0 through 63)).

The CIM system (200) in some embodiments further includes a read/write (RW) interface (216) connected to the memory array (100) for conventional reading and writing operations associated with memory arrays.

The CIM system (200) in some embodiments also includes an output interface (220), which in some examples includes a compensation module (222) connected to the memory array (100), and computation module (224) connected to the compensation module (222). As described below in more detail, the compensation module serves to form, with the computation module (224), a uniform environment, i.e., the same total capacitance, for pre-charging and sampling of the RBL's; the computation module (224) serves to compute quantities indicative of the signal values on the RBL's or certain combinations thereof. For example, as described in more detail below, in some embodiments, the computation module (224) is adapted to compute weighted sums or weighted averages of several RBL's. This is done in some embodiments through charge sharing among capacitors sized according to the relative positions of significance (most-significant bit (MSB) to least-significant-bit (LSB)) of the respective RBL's in a binary number. For example, the relative sizes of the capacitors in some embodiments are $2^3:2^2:2^1:2^0$ from MSB to LSB. As a result, the amplitude of the resultant signals correspond to sums of multi-bit input signals weighted by multi-bit weights.

Figure 3B:
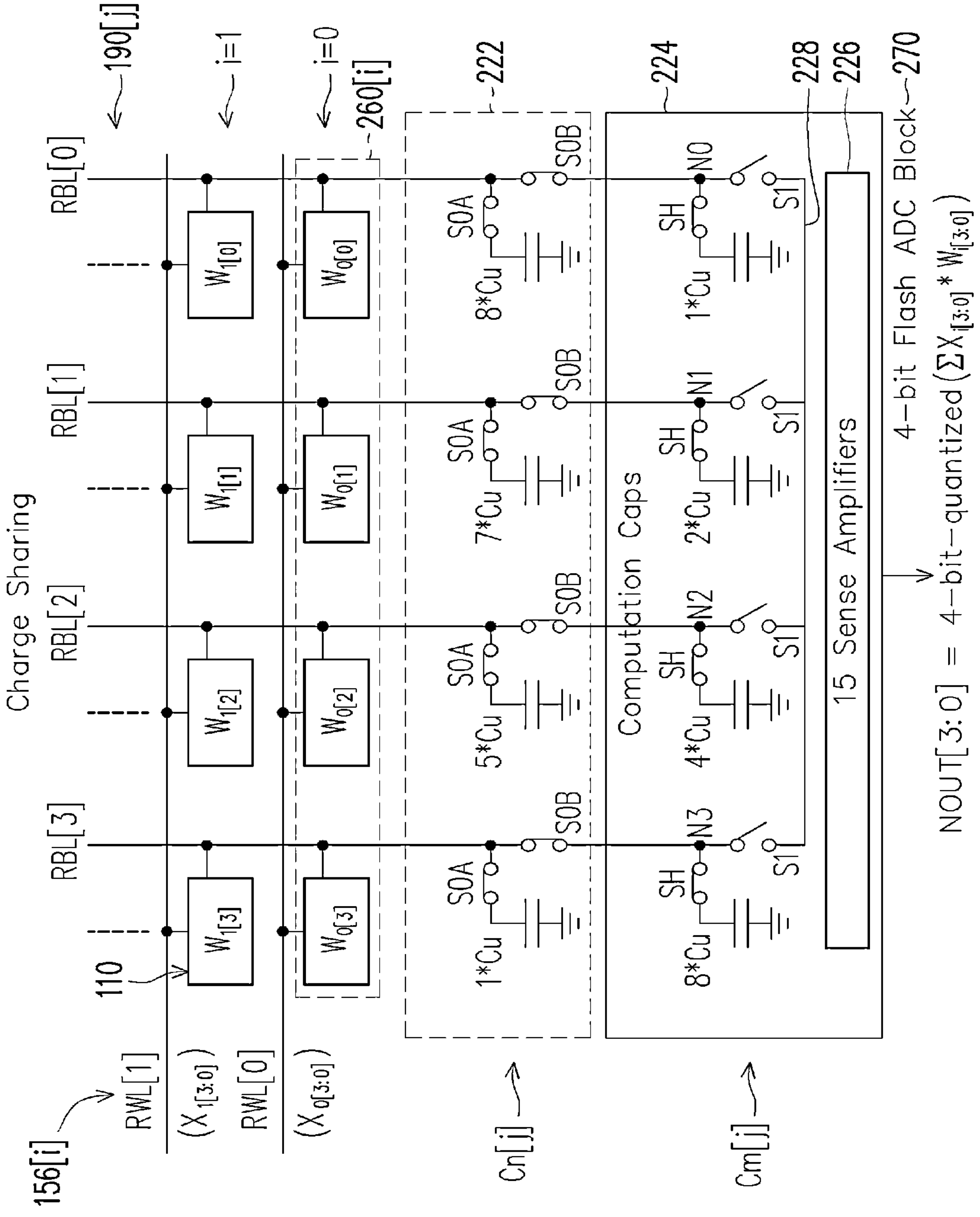
FIG. 3B shows the portion of a compute-in-memory system shown in FIG. 3A in a charge sharing state in accordance with some embodiments.

In some embodiments, as shown for a four-bit-wide segment (230) of the CIM system (200) in FIG. 2A and in more detail in FIGS. 3A and 3B, the compensation module (222) includes a set of compensation capacitors $C_n$[j] (j=0 through 3 for each four-bit-wide segment (230)), each associated with a respective RBL (190[j] (j=0 through 3)). As described in more detail below, the compensation capacitors in some embodiments are pair-wise connected in parallel with computation capacitors (described below) in certain stage of the computation process. The compensation capacitors are sized such that the total capacitance presented to the RBLs are the same, so that the same current in any given RBL would result in the same voltage on at the RBL. A pair of switch devices, S0A and S0B, such as any switching transistors, are associated with each compensation capacitor $C_n$[j], with S0A connecting the compensation capacitor $C_n$[j] to the respective RBL (190[j]), and S0B connecting the RBL (190[j]) to the computation module (224). Each compensation capacitor $C_n$[j] is connected at one end to the respective RBL (190[j]) through S0A, and at the other end to a voltage reference, such as ground.

The computation module (224) includes a set of integrators for integrating the current on each RBL. In some embodiments, integrators include computation capacitors $C_m$[j] (j=0 through 3 for each four-bit-wide segment (230)), each associated with a respective RBL (190[j] (j=0 through 3) and corresponding compensation capacitor $C_n$[j]). The computation capacitors in some embodiments are used in combination with the compensation capacitors to provide a capacitance to the respective RBLs to build up a voltage that is indicative of the sum of the weighted inputs for the RBLs. The computation capacitors in some embodiments, as explained briefly above, are paired with respective compensation capacitors to present the same capacitance to each RBL during certain steps of the computation process. As explained further below, the computation capacitors are sized relative to each other in some embodiments to attribute a significance to the respective RBLs. A pair of switch devices, SH and S1, such as any switching transistors, are associated with each computation capacitor $C_m$[j], with SH connecting the computation capacitor $C_m$[j] to the respective RBL (190[j]) via S0B, and S1 connecting, via SH, the computation capacitor $C_m$[j] to an analog output (228). Each computation capacitor $C_m$[j] is connected at one end to the analog output (228) through respective SH and S1, and at the other end to a voltage reference, such as ground.

In some embodiments, as shown in FIGS. 3A and 3B, subsets (e.g., 240 for Row[62] or 260[i] (i=0 through 63) for Row[i], each corresponding to a RWL[i]) of the memory cells (110) in each row i can store (e.g., by writing to the memory sells (110) from the WWL's) multi-bit weights. For example, in an embodiment in which four-bit weights are used, each subset (260[i]) of four memory cells [110] can store a four-bit weight $W_i=(W_{i[3]}W_{i[2]}W_{i[1]}W_{i[0]})_2$, where $W_{i[j]}$ represents the binary digit written by the i-th RWL (156[i]) to the memory cell [110] that is read by the j-th RBL (190[j]). For example, for a weight of $W_0=0101_2$ ($=5_{10}$) in the Row[0] (260[0]) the bits stored in the subset (260[0]) is $W_{0[3]}=0$, $W_{0[2]}=1$, $W_{0[1]}32$ 0, and $W_{0[0]}=1$. Similarly, for a weight of $W_1=1011_2$ ($=11_{10}$) in the Row[1] (260[1]) the bits stored in the subset (260[1]) is $W_{1[3]}=1$, $W_{1[2]}=0$, $W_{1[1]}=1$, and $W_{1[0]}=1$.

Thus, the array (100) of memory cells (110) in the example CIM system (200) shown in FIG. 2 can store 1024 (64×16) four-bit weights arranged in 64 rows and 16 columns.

In some embodiments, the capacitance of the computation capacitors $C_m$[j] are chosen according to their respective relative positions in the computation module, i.e., the index j. For example, in the embodiment shown in FIGS. 3A and 3B, the capacitance of the j-th computation capacitor $C_m$[j] in corresponding to RBL[j] is $2^jC_u$, where $C_u$ is a unit capacitance, which can be of any value suitable to the particular application. Thus, the capacitance of the computation capacitors are $1*C_u$ for $C_m$[0], $2*C_u$ for $C_m$[1], $4*C_u$ for $C_m$[2], and $8*C_u$ for $C_m$[3].

In some embodiments, the capacitance of the compensation capacitors $C_n$[j] are chosen according to their respective relative positions in the computation module, i.e., the index j. In some embodiments, the capacitance of the compensation capacitors $C_n$[j] are chosen such that $C_n$[j]+$C_m$[j]=constant, i.e., the RBLs are presented with the same (constant capacitance) when each pair of compensation and computation capacitors are connected in parallel, and $C_n$[j] is the difference between a fixed total capacitance and the respective computation capacitance $C_m$[j]. For example, in the embodiment shown in FIGS. 3A and 3B, where the total capacitance presented to each RBL is chosen to be $9*C_u$, the capacitance of the j-th compensation capacitor $C_n$[j] in corresponding to RBL[j] is 9*Cu−$C_m$[j]. Thus, the capacitance of the compensation capacitors are $8*C_u$ for $C_n$[0], $7*C_u$ for $C_n$[1], $5*C_u$ for $C_m$[2], and $1*C_u$ for $C_n$[3].

In some embodiments, the output interface (220) further includes a sense amplifier (226) for each RBL (190) for boosting the analog signal from the RBL (190). The output interface (220) in some embodiments further includes an analog-to-digital converter (ADC) (270) for each subset of RBL's associates with a column of multi-bit weights stored in the respective subsets (260) of memory cells (110). In some embodiments, as shown in FIG. 4, Flash ADC's, each having a number of voltage comparators (272[l], l=0 through $2^{n-1}$, where n is the number of binary digits in the multi-bit weights) can be used, with $2^j$ of the comparators used to the j-th RBL (190[j]). For example, in applications with four-bit weights, as shown in FIG. 4, a 15-comparator Flash ADC's (272[l], l=0 through 14) can be used. The signal from RBL[0] is connected to one comparator, SA7 (270[7] in this example); the signal from RBL[1] is connected to two comparators, SA6 and SA8 (270[6] and [8]) in this example; the signal from RBL[2] is connected to four comparators, SA5, SA9, SA4 and SA10 (270[5], [9], [4] and [10]) in this example; and the signal from RBL[3] is connected to eight comparators SA3, SA11, SA2, SA12, SA1, SA13, SA0 and SA14 (270[3], [11], [2], [12], [1], [13], [0] and [14]) in this example.

In some embodiments, the comparators (272) each include an input capacitor, and those input capacitors can be utilized as the computation capacitors, $C_m$. For example, in the embodiment shown in FIG. 4, assuming the input capacitor of each comparator (272) has a unit capacitance, $C_u$, then the input capacitor of the comparator SA7 can be used as the computation capacitor $C_m$[0]; those for SA6 and SA8 can be used (e.g., connected in parallel) as $C_m$[1]; those for SA5, SA9, SA4 and SA10 can be used (e.g., connected in parallel) as $C_m$[2]; and those for SA3, SA11, SA2, SA12, SA1, SA13, SA0 and SA14 can be used (e.g., connected in parallel) as $C_m$[3]. The total capacitance connected to each RBL is thus in proportion to the place value corresponding to the RBL, as discussed above. A distributed pattern (i.e., one in which subsets of the connections from each RBL (190[j] are located away from each other), such as the one shown in FIG. 4, in which each RBL (190) is connected to the comparators (272) minimizes the voltage dependency of the input capacitors used as unit capacitors ($C_u$).

In some embodiments, in-memory computation, such as that of weighted sum, can be performed using the CIM system disclosed in this disclosure. More specifically, a sum of inputs (e.g., 64 inputs), $X_i$, can be each weighted by a multi-bit (e.g., four-bit) weight, $(W_i)_k$, and the weighted inputs $X_i(W_i)_k$ can be summed together to generate an output $S_k$, that is the weighted sum for the k-th column of multi-bit weights. That is, $$S_k = \sum_i X_i(W_i)_k$$

Figure 5:
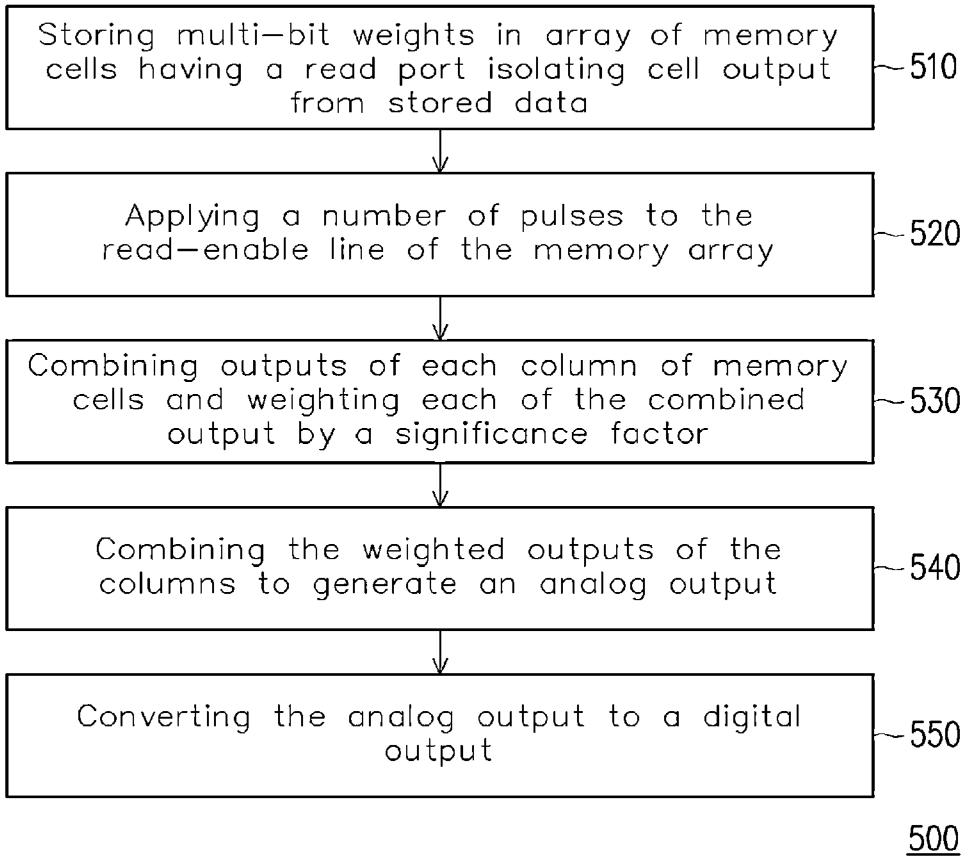
FIG. 5 is a flow chart outlining a method of computing in accordance with some embodiments.

As described above, in some embodiments, the digital inputs to the CIM system (200) can be represented by, or converted to, trains of pulses, with the number of pulses per counting cycle at each RWL being indicative of the amplitude of the input. Furthermore, the RWL's can be activated simultaneously because the RBL's are decoupled from the 6T memory cells (120), the RWL's can be activated simultaneously. Further as described above, according to some embodiments, a multi-bit weight, such as a four-bit weight, $W_i=(W_{i[3]}W_{i[2]}W_{i[1]}W_{i[0]})_2$, can be stored in a subset (260[i]) of a row (190[i]) of memory cells (110), as shown in FIGS. 3A and 3B. In some embodiments, as outlined in FIG. 5, computations (500) involving the application of the multi-bit weights to the respective inputs can be performed in the following manner:

First (510), a set of multi-bit weights (e.g., $W_i=(W_{i[3]}W_{i[2]}W_{i[1]}W_{i[0]})_2$) are stored in an array of memory cells, each having a memory unit (such as a 6T SRAM cell) adapted to store a signal at a node and a read port having a read-enable input line (such as RWL) and an output line (such as RBL), the read port adapted to, upon an activation signal at the read-enable input, generate at the output a signal indicative of the signal stored at the node in the memory unit and isolate the output line from the node.

Next (520), a set of pulsed signals, each indicative of a respective input number, are each applied to the read-enable inputs of a set of memory cells storing a respective multi-bit weight to generate a set of signals at the output lines of the respective memory cells, the set of output signals being indicative of an operation (e.g., multiplication) on the pulsed signals by the stored multi-bit weight.

Next (530), a combined read-port output (e.g., combined current) from the read output lines of the memory cells sharing each output line is measured (e.g., by RBL sampling, described in detail below) and given a significance factor corresponding to the significance (i.e., the place value) of the weight bit (e.g., j for $W_{i[j]}$) associated with the output line. For example, the MSB of a four-bit weight has a place value of 8 (i.e., $2^3$); the significance factor can be the place value itself, or some multiple of the place value. The significance factor can be given to each RBL by the use of a relative size of the corresponding computation capacitor, as described above.

Next (540), the combined read-port outputs from the respective read output lines are combined (e.g., by charge sharing, as described in detail below) in proportion to the respective significance factor to generate a computation output signal.

Next (550), the computation output signal is converted to a digital output (e.g., by a 15-comparator analog-to-digital converter (ADC)).

Figure 3C:
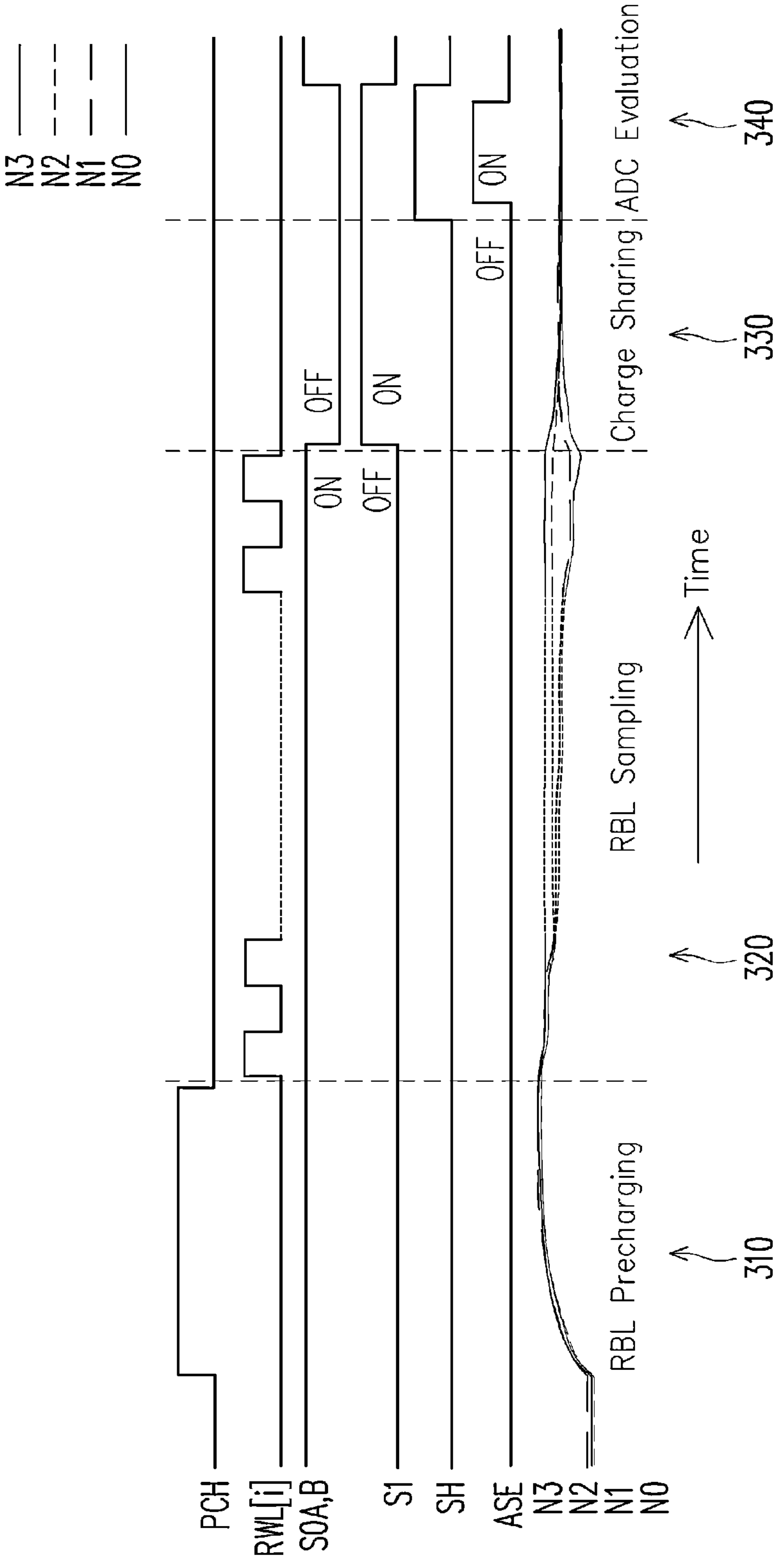
FIG. 3C shows time evolution of levels of the various signals in the portion of the compute-in-memory system shown in FIGS. 3A and 3B in accordance with some embodiments.

As shown in FIGS. 3A and 3B and 3C, in some embodiments, the analog signals on the RBL's can be measured and used to compute weighted sums of the inputs as follow:

First, during a precharge period (310), a precharge signal, PCH, is applied to each RBL[j] and the parallel combination of computation capacitor $C_m$[j] and compensation capacitor $C_n$[j], i.e., with S0A, S0B and SH conducting (ON) and S1 non-conducting (OFF). As each combination has the same capacitance, i.e., $9\times C_u$, all combinations is charged to the same total charge, and the voltages at all four nodes N3, N2, N1 and N0 rise to the same level, $V_{PCH}$. Next, during a RBL sampling period (320) (see FIGS. 3A and 3C), PCH is off, and input pulse trains are applied to respective RWL's, and, for each memory cell (110) having a "1" stored in it, each pulse on the respective RWL results in a cell current, $I_{cell}$, which discharges the RBL by a fixed amount determined by the amplitude of $I_{cell}$ and duration of each input pules. All memory cells sharing the same RBL contribute cell currents, and therefore the total discharge, to the extent they store "1"s. The voltage at each node N0, N1, N2 and N3 thus drops by an amount determined by the total discharge of the respective RBL and proportional to the bit-wise multiplication of weight bits with multi-bit inputs.

Next, during a charge sharing period (330) (see FIGS. 3B and 3C), S0A and S0B are switched off, SH remains on and S1 is switched on. As a result, the compensation capacitors $C_n$[j], j=0 through 3, are cut off, and the computation capacitors $C_m$[j], j=0 through 3, connected in parallel between ground and the output (228). Nodes N0, N1, N2 and N3 are also tied together and to the output (228). The voltage, $V_{out}$, at the output (228) (i.e., voltage across the computation capacitors $C_m$[j]) is thus the total charge stored in the compensation capacitors $C_m$[j] divided by the sum of the capacitance of the compensation capacitors $C_m$[j]:

$$V_{out} = -\frac{\sum_j Q[j]}{\sum_j C_m[j]} = -\frac{\sum_j Q[j]}{15\,C_u},$$

where Q[j] is the charge stored in the j-th computation capacitor $C_m$[j].

Because the capacitance of $C_m$[j] is $2^jC_u/9C_u$=of $2^j/9$ of the total capacitance ($9C_u$) on the j-th RBL, each computation capacitor $C_m$[j] takes up $2^j/9$ of the total charge stored on each RBL from the precharge step. $C_m$[3] thus has eight times the charge $C_m$[0] does at the end of the precharge period, $C_m$[2] four times, and $C_m$[1] twice. For the same reason, during the RBL sampling period, $C_m$[3] loses eight times the charge $C_m$[0] does for the same input and same weight bit value, $C_m$[2] four times, and $C_m$[1] twice. Thus, at the end of the charge sharing period, the contribution to the total charge, $\Sigma_j Q[j]$, from $C_m$[3] is eight times that from $C_m$[0], $C_m$[2] four times, and $C_m$[1] twice. The voltage, $V_{out}$, or the voltage drop, $\Delta V=V_{PCH}-V_{out}$, therefore represents a binary-weighted sum in which each RBL is assigned a weight proportional to the RBL's position of significance in the binary weight, $W_i=(W_{i[3]}W_{i[2]}W_{i[1]}W_{i[0]})_2$, or more generally, $W_i=(\ldots W_{i[j]} \ldots W_{i[2]}W_{i[1]}W_{i[0]})_2$. For example, in the embodiment shown in FIGS. 3A and 3B, the voltage at the analog output (228), and thus at nodes N3, N2, N1, and N0 after charge sharing, is 8/15 from RCL[3] (most significant bit (MSB)), 4/15 from RCL[2], 2/15 from RCL[1], and 1/15 from RCL[0] (least significant bit (LSB).

Next, during a ADC evaluation period (an SAE signal "ON" to enable the ADC (226) to convert the voltage on the RBL's (190), i.e., at N3, N2, N1, and N0, after the above-described charge sharing to a digital output signal, in this example a four-digit binary number ($0000_2$ through $1111_2$) corresponding to the voltage. An in-memory computation involving multiply-and-accumulation, with multi-bit inputs and multi-bit weight, is thus accomplished.

Because the RBL's are decoupled from the respective 6T memory cells, multiple RWL's can be activated simultaneously to apply the weights stored in the memory cells (110) without upsetting the stored state of any memory cell. Computation speed is thus improved as compared the situation in which the RWL's must be applied one at a time.

Thus, in accordance with some disclosed embodiments, a computing device includes a memory array having a set of memory cells grouped in rows and columns of memory cells, each of the memory cells having a memory unit adapted to store data, and a read port having an read-enable input and an output; read-enable lines, each connected to, and adapted to transmit an input signal to, the read-enable inputs of the read ports of a respective row of memory cells; data-output lines, each connected to the outputs of the read ports of a respective column of memory cells; an output interface having a computation module that includes a set of capacitors, each being connectable to a respective one of the data-output lines and having a capacitance, at least two of the of capacitors having different capacitance from each other, the output interface being configured to permit the capacitors to share charge stored on them.

In accordance with some disclosed embodiments, a method of computing includes storing a plurality of multi-bit weights in a memory array having memory cells organized in rows and columns and each having a memory unit adapted to store a signal at a node and a read port having a read-enable input and an output, the read port adapted to, upon an activation signal at the read-enable input, generate at the output a signal indicative of the signal stored at the node in the memory unit and isolate the output from the node, the memory array further having a plurality of read-enable lines, each connected to the read-enable inputs of a row of the memory cells, where storing each of the plurality of multi-bit weights includes storing the multi-bit weight in a row of memory cells sharing a respective one of the read-enable lines, the memory array further having data-output lines, each connected to the outputs of the read ports of a column of the memory cells; applying trains of pulsed signals to the respective read-enable lines to generate an output signal on each of the data-output lines; weighting the combined output signal by a significance factor, at least two of the significance factors being different from each other;

combining the weighted output signals to generate an analog output; and converting the analog output to a digital output.

In accordance with some disclosed embodiments, a computing method includes storing multi-bit weights in a memory array having a plurality of memory cells organized in rows and columns and each having a memory unit adapted to store a signal at a node and a read port having a read-enable input and an output, the read port adapted to, upon an activation signal at the read-enable input, generate at the output a signal indicative of the signal stored at the node in the memory unit and isolate the output from the node; simultaneously multiplying an input signal by each bit of each of the multi-bit weights to generate output signals at the output of each of the read ports; summing the output signals at the outputs of the read ports of the memory cells in each column; weighting each of the sums of the output signals at the outputs of the read ports of the memory cells in each column by a different significance factor to generate a respective weighted sum; and combining the weighted sums to generate an analog output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A computing device, comprising:

a memory array comprising a plurality of memory cells grouped in rows and columns of memory cells, each of the memory cells comprising a memory unit adapted to store data, and a read port having a read-enable input and an output;

a plurality of read-enable lines, each connected to, and adapted to transmit an input signal to, the read-enable inputs of the read ports of a respective row of memory cells;

a plurality of data-output lines, each connected to the outputs of the read ports of a respective column of memory cells;

an output interface comprising an analog-to-digital converter (ADC) having a plurality of analog inputs, each with a respective input capacitor; and a plurality of switching devices adapted to:

connect the data-output lines to respective non-overlapping plurality of subsets of the input capacitors, each of the plurality of subsets having a respective total capacitance, at least two of the plurality of subsets of input capacitors having different total capacitance from each other, and connect the plurality of subsets of capacitors to each other in parallel, the output interface further comprising a compensation module comprising a plurality of capacitors, each being connectable to a respective one of the data-output lines and having a respective capacitance, the output interface being configured to, for each of the plurality of data-output lines, connect the respective subset of input capacitors to the respective capacitor in the compensation module to form a capacitive combination having a total capacitance.

2. The computing device of claim 1, further comprising an input interface connected to the plurality of read-enable lines and configured to generate a plurality of pulses on each of at least subset of the plurality of read-enable lines.

3. The computing device of claim 2, wherein the input interface comprises a plurality of counters, each having a binary data input adapted to receive digital input data and having an output connected to a respective one of the plurality of read-enable lines, the counter being configured to generate a number of pulses, the number being indicative of a value of the digital input.

4. The computing device of claim 1, wherein the total capacitance of the combinations for at least a subset of the data-output lines being substantially the same.

5. The computing device of claim 1, further comprising a digital read/write (RW) interface connected to the memory array and adapted to read and write data from and to the memory cells.

6. The computing device of claim 1, wherein each of the memory cells is an eight-transistor static random-access memory (SRAM) cell having a six-transistor SRAM memory unit having two inverters reverse-coupled to each other and two access transistors, each switchably connecting a respective junction between the two invertors to a respective data line through which data to be written to the six-transistor SRAM memory unit is transmitted, the read port having a first and second transistors, each having a control electrode and a main current path, the control electrode being adapted to control current flow through the current path the main paths being serially connected between the data-output line and a voltage reference point, the control electrode of one of the first transistor being connected to the read-enable line for the memory cell, and the control electrode of one of the first transistor being connected to a junction between the two inverters.

7. The computing device of claim 1, wherein the plurality of input capacitors of the ADC are arranged in a linear array, wherein at least one subset of the plurality of input capacitors connectable to one of the data-output lines includes at least a first subset of input capacitors and second subset of input capacitors, each subset connectable to a respective one of the data-output lines, at least two input capacitors in the first subset of the input capacitors being separated by at least one input capacitor in the second subset.

8. The computing device of claim 1, wherein the output interface is configured to:

during a first period, connect each data-output line to a parallel combination of one of the compensation capacitors and a corresponding one of the subsets of in capacitors; and during a second period subsequent to the first period, disconnect each capacitor in the computation module from the respective capacitor in the compensation module and from the respective data-output line, and connect the plurality of input capacitors in parallel.

9. The computing device of claim 8, further comprising an input interface connected to the plurality of read-enable lines and configured to generate a plurality of pulses on each of at least subset of the plurality of read-enable lines during the first period.

10. The computing device of claim 1, wherein the plurality of memory cells are substantially identical to each other, and at least two of the plurality of subsets of input capacitors in the computation module have capacitance differing from each other by a factor of substantially $2^n$, where n is an integer.

11. A method of making a computing device, the method comprising:

forming a memory array comprising a plurality of memory cells grouped in rows and columns of memory cells, each of the memory cells comprising a memory unit adapted to store data, and a read port having a read-enable input and an output;

forming a plurality of read-enable lines, each connected to, and adapted to transmit an input signal to, the read-enable inputs of the read ports of a respective row of memory cells;

forming a plurality of data-output lines, each connected to the outputs of the read ports of a respective column of memory cells;

forming an output interface comprising an analog-to-digital converter (ADC) having a plurality of analog inputs, each with a respective input capacitor; and forming a plurality of switching devices adapted to:

connect the data-output lines to respective non-overlapping plurality of subsets of the input capacitors, each of the plurality of subsets having a respective total capacitance, at least two of the plurality of subsets of input capacitors having different total capacitance from each other, and connect the plurality of subsets of capacitors to each other in parallel.

12. The method of claim 11, further comprising forming an input interface connected to the plurality of read-enable lines and configured to generate a plurality of pulses on each of at least subset of the plurality of read-enable lines.

13. The method of claim 12, wherein the forming input interface comprises forming a plurality of counters, each having a binary data input adapted to receive digital input data and having an output connected to a respective one of the plurality of read-enable lines, the counter being configured to generate a number of pulses, the number being indicative of a value of the digital input.

14. The method of claim 11, wherein the forming output interface further comprising forming a compensation module comprising a plurality of capacitors, each being connectable to a respective one of the data-output lines and having a capacitance, the output interface being configurable to, for each of the plurality of data-output lines, connect the respective subset of input capacitors to the respective capacitor in the compensation module to form a capacitive combination having a total capacitance, the total capacitance of the combinations for at least a subset of the data-output lines being substantially the same.

15. The method of claim 14, wherein the connecting the data-output lines to respective non-overlapping plurality of subsets of the input capacitors comprises connecting the jth data-output line to $2^j$ of the input capacitors, where j denotes the position of significance of the weight bits stored in the respective column, with j=0 denoting the least significant bit, and $C_u$ being a unit capacitance.

16. The method of claim 14, wherein at least two input capacitors in at least one of the subsets of the input capacitors are separated by at least one input capacitor in another one of the subsets of the input capacitors.

17. The method of claim 11, wherein the forming an output interface comprising an analog-to-digital converter (ADC) comprises forming a plurality of comparators, each having an input connected to a respective one of the input capacitors.

18. A method of making a computing device, the method comprising:

forming a memory array comprising a plurality of memory cells grouped in rows and columns of memory cells, each of the memory cells comprising a memory unit adapted to store data, and a read port having a read-enable input and an output;

forming a plurality of read-enable lines, each connected to, and adapted to transmit an input signal to, the read-enable inputs of the read ports of a respective row of memory cells;

forming a plurality of data-output lines, each connected to the outputs of the read ports of a respective column of memory cells; and forming an output interface, the step of forming the output interface comprising:

forming a computation module comprising a first plurality of capacitors and a first plurality of switch elements, each connecting the respective one of the capacitors to a respective one of the data-output lines, each of the plurality of capacitors having a respective capacitance, at least two of the plurality of capacitors having different capacitance from each other, the output interface further comprising a second plurality of switch elements configured to connect the plurality of capacitors in parallel; and a compensation module comprising a second plurality of capacitors and a third plurality of switch elements, each connecting a respective one of the second plurality of capacitors to a respective one of the data-output lines, each of the second plurality of capacitors having a respective capacitance, the output interface having a fourth plurality of switch elements, each being adapted to connect the respective capacitor in the compensation module to the respective capacitor in the computation module to form a capacitive combination having a total capacitance, the total capacitance of the combinations for at least a subset of the data-output lines being substantially the same.

19. The method of claim 18, wherein each of the memory cells is an eight-transistor static random-access memory (SRAM) cell having a six-transistor SRAM memory unit having two inverters reverse-coupled to each other and two access transistors, each switchably connecting a respective junction between the two invertors to a respective data line through which data to be written to the six-transistor SRAM memory unit is transmitted, the read port having a first and second transistors, each having a control electrode and a main current path, the control electrode being adapted to control current flow through the current path the main paths being serially connected between the data-output line and a voltage reference point, the control electrode of one of the first transistor being connected to the read-enable line for the memory cell, and the control electrode of one of the first transistor being connected to a junction between the two inverters.

20. The computing device of claim 10, wherein the ADC comprises a plurality of comparators, each having an input connected to a respective one of the input capacitors.

* * * * *